(12) United States Patent
Nomoto et al.

(10) Patent No.: US 9,029,926 B2
(45) Date of Patent: *May 12, 2015

(54) SOLID-STATE IMAGING DEVICE

(71) Applicant: Sony Corporation, Tokyo (JP)

(72) Inventors: Kazuki Nomoto, Kanagawa (JP);
Kaneyoshi Takeshita, Tokyo (JP);
Hiroyuki Ohri, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/145,256

(22) Filed: Dec. 31, 2013

(65) Prior Publication Data
US 2014/0117429 A1 May 1, 2014

Related U.S. Application Data

(63) Continuation of application No. 13/372,619, filed on Feb. 14, 2012, now Pat. No. 8,633,524.

(30) Foreign Application Priority Data

Mar. 2, 2011 (JP) .................... 2011-045329

(51) Int. Cl.
*H01L 27/02* (2006.01)
*H01L 27/146* (2006.01)

(52) U.S. Cl.
CPC .... *H01L 27/14643* (2013.01); *H01L 27/14603* (2013.01); *H01L 27/1463* (2013.01); *H01L 27/14641* (2013.01)

(58) Field of Classification Search
CPC ............... H01L 27/14643; H01L 12/14603; H01L 27/14641; H01L 27/1463
USPC ............. 257/292, 436, E27.153, 31.058
See application file for complete search history.

(56) References Cited

U.S. PATENT DOCUMENTS 8,633,524 B2 * 1/2014 Nomoto et al. ............... 257/292

FOREIGN PATENT DOCUMENTS

JP 2001-156280 6/2001
JP 2006-024907 1/2006

* cited by examiner

*Primary Examiner* — Michael Lebentritt
(74) *Attorney, Agent, or Firm* — Fishman Stewart Yamaguchi PLLC

(57) ABSTRACT

A solid-state imaging device includes a substrate, a photoelectric conversion section, a first impurity layer having a carrier polarity of a second conductivity type, a charge-to-voltage converting section, an amplifying section, and a second impurity layer having a carrier polarity of the second conductivity type. The second impurity layer is disposed in a region between the photoelectric conversion section and the amplifying section. The second impurity concentration of the second P-type impurity layer is made higher than the first impurity concentration of the first impurity layer.

7 Claims, 7 Drawing Sheets

SOLID-STATE IMAGING DEVICE

CROSS REFERENCES TO RELATED APPLICATIONS

This is a Continuation Application of U.S. patent application Ser. No. 13/372,619, filed Feb. 14, 2012, which claims priority from Japanese Patent Application JP 2011-045329 filed with the Japanese Patent Office on Mar. 2, 2011 the entire contents of which being incorporated herein by reference.

BACKGROUND

The present disclosure relates to a solid-state imaging device.

In related art, solid-state imaging devices fabricated by forming various elements such for example as MOS (Metal-Oxide-Semiconductor) transistors and photodiodes (light receiving sections) on a semiconductor substrate are used in various technical fields. In such a solid-state imaging device, for example, a diffused region formed by an impurity layer of an N-type carrier polarity, a source/drain region of a MOS transistor, and the like are formed on an impurity layer of a P-type carrier polarity (which impurity layer will hereinafter be referred to as a P-type well).

In the solid-state imaging device of the constitution as described above, carriers flow out from peripheral parts of the source/drain region and the diffused region to the light receiving sections via the P-type well, thereby increasing dark current and thus degrading image quality. Accordingly, various techniques have been proposed in the past to solve this problem (see Japanese Patent Laid-Open Nos. 2001-156280 and 2006-24907 (hereinafter referred to as Patent Documents 1 and 2), for example).

Patent Document 1 proposes a technique for remedying the outflow of carriers to adjacent pixels by making the impurity concentration of a P-type well forming the source/drain region of a MOS transistor higher than the impurity concentration of a P-type well forming a light receiving section. In addition, Patent Document 2 proposes a technique for reducing dark current by providing a P+ guard layer between an N+ region of a photoelectric conversion section (light receiving section) and an N+ region forming a source/drain region of a MOS transistor, the N+ regions being formed on a P-type well.

SUMMARY

While various techniques for reducing dark current in solid-state imaging devices have been proposed in the past as described above, there is a desire for the development of a technique for further reducing dark current in this technical field. The present disclosure has been made in view of the above situation. It is desirable to provide a solid-state imaging device capable of further reducing dark current.

A solid-state imaging device according to an embodiment of the present disclosure includes a substrate, a photoelectric conversion section, a first impurity layer, a charge-to-voltage converting section, an amplifying section, and a second impurity layer. The constitutions and functions of the respective parts and the respective layers are as follows. The photoelectric conversion section is disposed on the substrate, includes an impurity region having a carrier polarity of a first conductivity type, and converts incident light into a signal charge. The first impurity layer is disposed on the substrate, has a carrier polarity of a second conductivity type opposite from the first conductivity type, and has a first impurity concentration. The charge-to-voltage converting section is disposed on the first impurity layer, includes an impurity region having a carrier polarity of the first conductivity type, and converts the signal charge converted by the photoelectric conversion section into voltage. The amplifying section is disposed on the first impurity layer, has a source/drain region with a carrier polarity of the first conductivity type, and amplifies the voltage converted by the charge-to-voltage converting section. The second impurity layer is disposed in a region between the photoelectric conversion section and the amplifying section, has a carrier polarity of the second conductivity type, and has a second impurity concentration higher than the first impurity concentration.

As described above, the solid-state imaging device according to the embodiment of the present disclosure includes the second impurity layer of the second conductivity type in the region between the amplifying section having the source/drain region of the first conductivity type which source/drain region is formed on the first impurity layer of the second conductivity type and the photoelectric conversion section including the impurity region of the first conductivity type. The second impurity concentration of the second impurity layer is made higher than the first impurity concentration of the first impurity layer. Thus, the solid-state imaging device according to the embodiment of the present disclosure can further reduce dark current by suppressing the outflow of carriers occurring in a region on the substrate side of the source/drain region to the photoelectric conversion section.

DETAILED DESCRIPTION OF THE PREFERRED EMBODIMENTS

An example of solid-state imaging devices according to preferred embodiments of the present disclosure will hereinafter be described in the following order with reference to the drawings. However, the present disclosure is not limited to the following example.

Figure 1:
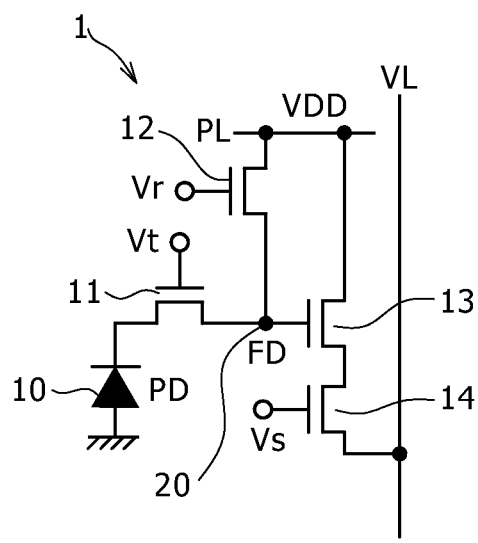
FIG. 1 is an equivalent circuit diagram showing an example of a configuration of a pixel.

1. First Embodiment: Example of Basic Constitution
2. Second Embodiment: Example of Disposing Third P-Type Impurity Layer in Region between Photoelectric Conversion Section and Charge-to-Voltage Converting Section
3. Third Embodiment: Example of Disposing Diffusion Isolation Layer in Region between Photoelectric Conversion Sections Adjacent to Each Other
4. Fourth Embodiment: Example of Forming Second P-Type Impurity Layer within First P-Type Impurity Layer 1. First Embodiment Schematic Constitution of Pixel A solid-state imaging device for example includes a pixel array section (not shown) formed by arranging a plurality of pixels two-dimensionally (in the form of an array). FIG. 1 shows an example of an equivalent circuit of each pixel forming the pixel array section. A pixel 1 in the example shown in FIG. 1 includes a photoelectric conversion section 10, a transfer section 11, a reset section 12, an amplifying section 13, a selecting section 14, and a charge-to-voltage converting section 20.

The photoelectric conversion section 10 is formed by a photodiode (PD), for example. The photoelectric conversion section 10 converts incident light into a signal charge. Incidentally, the photoelectric conversion section 10 has an anode electrode connected to a negative side power supply (for example a ground), and has a cathode electrode electrically connected to the gate of the amplifying section 13 via the transfer section 11.

The transfer section 11 is for example formed by a MOS transistor of an N-type carrier polarity (which MOS transistor will hereinafter be referred to as an NMOS transistor). The transfer section 11 is disposed between the cathode electrode of the photoelectric conversion section 10 and the charge-to-voltage converting section 20. The transfer section 11 is set in an on state when a high-level transfer pulse Vt is applied to the gate of the transfer section 11, and transfers the signal charge resulting from photoelectric conversion in the photoelectric conversion section 10 to the charge-to-voltage converting section 20.

The reset section 12 is for example formed by an NMOS transistor. The reset section 12 is disposed between the charge-to-voltage converting section 20 and a power supply line PL. The reset section 12 is set in an on state when a high-level reset pulse Vr is applied to the gate of the reset section 12. This operation is performed before the operation of transferring the signal charge from the photoelectric conversion section 10 to the charge-to-voltage converting section 20. Thereby, the signal charge of the charge-to-voltage converting section 20 is discarded to the power supply line PL to reset the charge-to-voltage converting section 20.

The amplifying section 13 is for example formed by an NMOS transistor. The amplifying section 13 is disposed between the power supply line PL and the drain of the selecting section 14. The amplifying section 13 outputs the potential of the charge-to-voltage converting section 20 after being reset by the reset section 12 as a reset signal (reset level) to the selecting section 14. In addition, the amplifying section 13 amplifies the potential of the charge-to-voltage converting section 20 after the transfer of the signal charge from the photoelectric conversion section 10 to the charge-to-voltage converting section 20, and outputs the amplified signal as a light accumulation signal (pixel signal) to the selecting section 14.

The selecting section 14 is for example formed by an NMOS transistor. The selecting section 14 is disposed between the source of the amplifying section 13 and a vertical signal line VL. The selecting section 14 is set in an on state when a high-level selecting pulse Vs is applied to the gate of the selecting section 14. The pixel 1 is thereby set in a selected state. In the selected state, the selecting section 14 relays the pixel signal output from the amplifying section 13 to the vertical signal line VL. Incidentally, the arrangement position of the selecting section 14 is not limited to the example shown in FIG. 1. The selecting section 14 may be disposed between the power supply line PL and the drain of the amplifying section 13.

The charge-to-voltage converting section 20 (FD: floating diffusion) is formed at a node where the source of the transfer section 11 and the gate of the amplifying section 13 are electrically connected to each other. The charge-to-voltage converting section 20 converts the signal charge converted by the photoelectric conversion section 10 into a voltage (potential). Incidentally, a more detailed constitution of the charge-to-voltage converting section 20 will be described later.

In the above-described example of FIG. 1, the pixel 1 is formed with four NMOS transistors. However, the present disclosure is not limited to this. An arbitrary constitution can be formed as long as the constitution is configured so as to be able to output a charge accumulated in the pixel 1 as an electric signal to the vertical signal line VL provided for each column. For example, one NMOS transistor may serve as the amplifying section 13 and the selecting section 14, and the pixel 1 may be formed with three NMOS transistors.

[Constitution in Vicinity of Photoelectric Conversion Section]

When the pixel 1 of the constitution shown in FIG. 1 is actually formed on a semiconductor substrate, the respective parts formed by the NMOS transistors (the transfer section 11, the reset section 12, the amplifying section 13, and the selecting section 14) and the charge-to-voltage converting section 20 are formed on the periphery of the photoelectric conversion section 10, for example.

Figure 2:
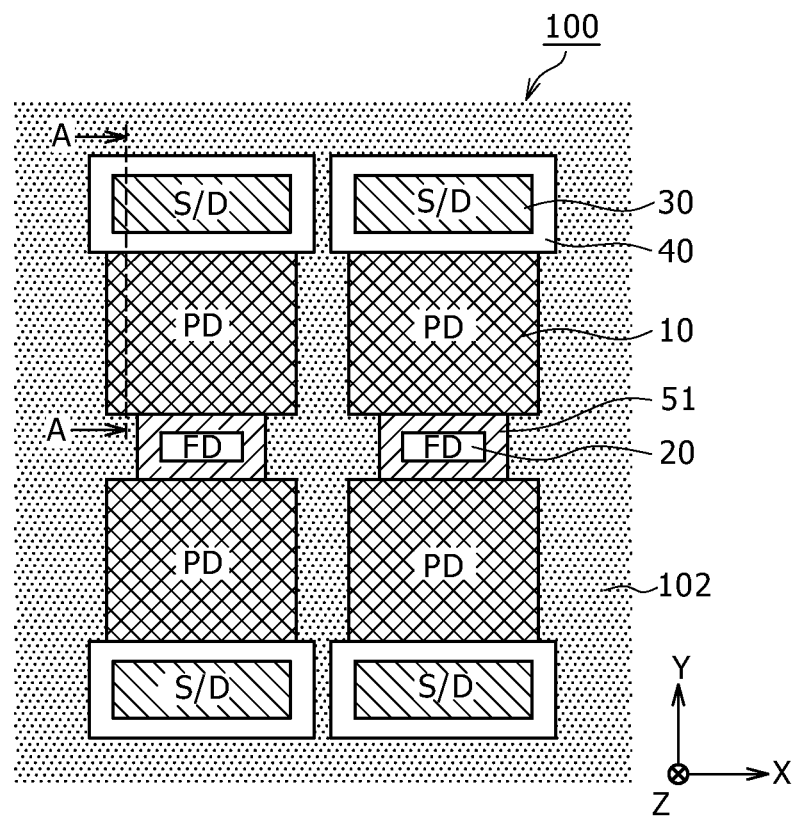
FIG. 2 is a diagram showing an example of a schematic constitution of the vicinity of photoelectric conversion sections in a solid-state imaging device according to a first embodiment.
Figure 3:
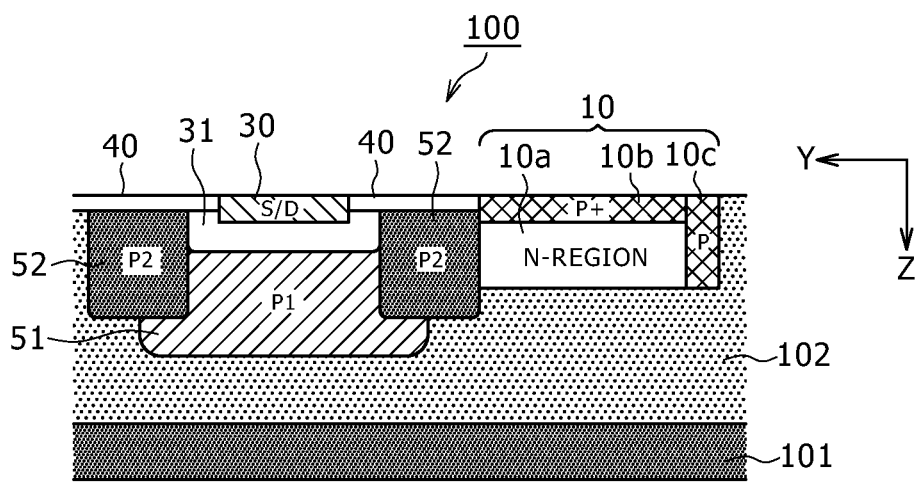
FIG. 3 is a sectional view taken along a line A-A of FIG. 2.

FIG. 2 and FIG. 3 show a schematic constitution of parts in the vicinity of the photoelectric conversion section 10 in the solid-state imaging device according to the present embodiment. FIG. 2 is a schematic diagram of an arrangement of the parts in the vicinity of the photoelectric conversion section 10 in a light receiving surface of the solid-state imaging device 100 according to the present embodiment. FIG. 3 is a sectional view taken along a line A-A of FIG. 2.

However, in order to simplify description, FIG. 2 and FIG. 3 show only principal parts involved in an effect of suppressing dark current in the solid-state imaging device 100 according to the present embodiment. In addition, to simplify description, FIG. 2 and FIG. 3 show a schematic constitution of a laminated region from the semiconductor substrate to a surface in which the source/drain region of an NMOS transistor is formed. In addition, to simplify description, FIG. 2 shows only a region of four pixels 1 adjacent to each other in a column direction and a row direction in the pixel array section (not shown). Further, for more clarification of the internal structure of the parts in the vicinity of the photoelectric conversion section 10, dimensions of the parts in the vicinity of the photoelectric conversion section 10 and dimensions between the parts in FIG. 3 are changed from those dimensions in FIG. 2. Incidentally, the above-described display method for simplifying description in FIG. 2 and FIG. 3 will be similarly applied in FIGS. 4 to 10 to be used in description later of a second to a fourth embodiment.

In addition, in FIG. 2 and FIG. 3, directions within the light receiving surface of the solid-state imaging device 100 will be represented by a first direction (X-direction) and a second direction (Y-direction) orthogonal to the first direction, and a direction of thickness of an N-type semiconductor substrate 101 to be described later (direction of depth of the solid-state imaging device 100) will be represented by a Z-direction. Incidentally, the definition of these directions in the present embodiment (FIG. 2 and FIG. 3) will be similarly applied in FIGS. 4 to 10 to be used in description later of the second to fourth embodiments.

(1) Constitution of Solid-State Imaging Device

The solid-state imaging device 100 includes an N-type semiconductor substrate 101 (substrate) and a P-type epitaxial layer 102 formed on the N-type semiconductor substrate 101. The solid-state imaging device 100 also includes a photoelectric conversion section 10, a first P-type impurity layer 51 (first impurity layer, which will hereinafter be referred to as a first P-type well 51), and a second P-type impurity layer 52 (second impurity layer, which will hereinafter be referred to as a second P-type well 52), the photoelectric conversion section 10, the first P-type well 51, and the second P-type well 52 being formed on the P-type epitaxial layer 102.

The solid-state imaging device 100 further includes a charge-to-voltage converting section 20 and a source/drain region section 30 (S/D: a source/drain region) of an NMOS transistor, the charge-to-voltage converting section 20 and the source/drain region section 30 being formed on the first P-type well 51. The solid-state imaging device 100 also includes an element isolation region section 40 (element isolation layer) disposed in a region between the photoelectric conversion section 10 and the source/drain region section 30. Incidentally, the source/drain region section 30 shown in FIG. 2 and FIG. 3 is the source/drain region section of the amplifying section 13 in FIG. 1.

In the solid-state imaging device 100 according to the present embodiment, as shown in FIG. 2, the charge-to-voltage converting section 20 is formed in such a position as to be opposed to the source/drain region section 30 with the photoelectric conversion section 10 interposed between the charge-to-voltage converting section 20 and the source/drain region section 30 along the Y-direction. Incidentally, the arrangement position of the source/drain region section 30 is not limited to the example shown in FIG. 2. For example, the source/drain region section 30 may be disposed in a part on a side of the photoelectric conversion section 10 in the X-direction in FIG. 2 (part on a left side or a right side in FIG. 2). In addition, in the present embodiment, the charge-to-voltage converting section 20 is disposed in a region between photoelectric conversion sections 10 adjacent to each other in the Y-direction in FIG. 2, and two pixels 1 share one charge-to-voltage converting section 20. However, the present disclosure is not limited to this. A charge-to-voltage converting section 20 may be provided for each pixel 1.

Further, in the solid-state imaging device 100 according to the present embodiment, as shown in FIG. 2, a plurality of photoelectric conversion sections 10 are arranged in one row along the X-direction, a plurality of charge-to-voltage converting sections 20 are arranged in one row along the X-direction, and a plurality of source/drain region sections 30 are arranged in one row along the X-direction.

(2) Constitution of Parts

The photoelectric conversion section 10 has an impurity layer 10a of an N-type (first conductivity type) carrier polarity (which impurity layer is an impurity region, and will hereinafter be referred to as an N-type impurity layer 10a).

The photoelectric conversion section 10 also has a pinning layer 10b of a P-type (second conductivity type) carrier polarity (which pinning layer will hereinafter be referred to as a P-type pinning layer 10b) which pinning layer is formed on a surface (upper surface in FIG. 3) of the N-type impurity layer 10a which surface is on an opposite side from the side of the N-type semiconductor substrate 101. The photoelectric conversion section 10 further includes a P-type impurity layer 10c formed on a side surface (right side surface in FIG. 3) of the N-type impurity layer 10a which side surface is on an opposite side from the side of the source/drain region section 30. Incidentally, dark current in the surface of the photoelectric conversion section 10 (light receiving section) can be suppressed by forming the P-type pinning layer 10b in the surface of the photoelectric conversion section 10.

The charge-to-voltage converting section 20 is formed by a high-concentration N-type impurity layer (impurity region). Incidentally, though not shown in FIG. 2 or FIG. 3, in the present embodiment, a depletion layer is formed at a boundary between the charge-to-voltage converting section 20 and the first P-type well 51 (see FIG. 5 for a second embodiment to be described later).

The source/drain region section 30 is formed by a high-concentration N-type impurity layer. Incidentally, in the present embodiment, as shown in FIG. 3, a depletion layer 31 is formed at a boundary between the source/drain region section 30 and the first P-type well 51.

The element isolation region section 40 is formed by an LOCOS (local oxidation of silicon) or STI (shallow trench isolation) technique. In addition, in the example shown in FIG. 2, the element isolation region section 40 is formed so as to surround the periphery of the source/drain region section 30.

Incidentally, in the present embodiment, an element isolation region section formed by a technique such for example as LOCOS or STI may be provided also to a region between photoelectric conversion sections 10 adjacent to each other along the X-direction in FIG. 2 in order to separate the adjacent photoelectric conversion sections 10 from each other. Alternatively, a diffusion isolation region section formed by a method of diffusion isolation may be formed in the region between the photoelectric conversion sections 10 adjacent to each other along the X-direction in FIG. 2.

The first P-type well 51 is formed by a P-type impurity layer having a higher impurity concentration P1 (first impurity concentration) than the impurity concentration of the P-type epitaxial layer 102. Incidentally, the first P-type well 51 disposed in a region of the charge-to-voltage converting section 20 on the side of the N-type semiconductor substrate 101 (which region will hereinafter be referred to as a lower part) and the first P-type well 51 disposed in the lower part of the source/drain region section 30 may be connected to each other, or may be disposed separately from each other. In addition, while description in the present embodiment has been made of an example in which the first P-type well 51 is provided in the lower parts of the charge-to-voltage converting section 20 and the source/drain region section 30, the present disclosure is not limited to this. For example, the first P-type well 51 may be formed over the entire surface of the N-type semiconductor substrate 101, and not only the charge-to-voltage converting section 20 and the source/drain region section 30 but also the photoelectric conversion section 10 may be formed on the first P-type well 51.

The second P-type well 52 is formed by a P-type impurity layer having a higher impurity concentration P2 (second impurity concentration: P2>P1) than the impurity concentration P1 of the first P-type well 51. Incidentally, the impurity concentration P2 of the second P-type well 52 can be higher than the impurity concentration P1 of the first P-type well 51 by at least about 25%, for example. However, a ratio between the impurity concentration P1 of the first P-type well 51 and the impurity concentration P2 of the second P-type well 52 is not limited to this, but is set appropriately according to conditions such as a use, for example. In addition, while the second P-type well 52 is generally formed by a technique of ion implantation, for example, the present disclosure is not limited to this. The second P-type well 52 may be formed by a technique of selective epitaxial growth, for example.

In addition, as shown in FIG. 3, the second P-type well 52 is formed in the lower part of the element isolation region section 40. Specifically, in the present embodiment, the second P-type well 52 is formed in a region between the source/drain region section 30 (and the first P-type well 51 disposed in the lower part of the source/drain region section 30) and the photoelectric conversion section 10. Incidentally, in the present embodiment, the second P-type well 52 is formed so as to surround the periphery of the source/drain region section 30.

Further, the second P-type well 52 is formed so as to span a region from a surface of the element isolation region section 40 on the side of the N-type semiconductor substrate 101 (which surface will hereinafter be referred to as a lower surface) to a deep position in the first P-type well 51 (position nearer to the N-type semiconductor substrate 101) in the Z-direction in FIG. 3. Incidentally, FIG. 3 shows an example in which the second P-type well 52 is formed in a region from the lower surface of the element isolation region section 40 to a position deeper than the lower surface of the N-type impurity layer 10a of the photoelectric conversion section 10.

Because the second P-type well 52 of the above-described constitution is disposed in a region approximately as narrow as the width of the element isolation region section 40, a PN junction surface having a steep concentration gradient of a P-type impurity is formed at a boundary between the photoelectric conversion section 10 and the source/drain region section 30. That is, a barrier for carriers occurring in the lower part (lower region) of the source/drain region section 30 is formed at the boundary between the photoelectric conversion section 10 and the source/drain region section 30.

As a result, the present embodiment can suppress the outflow of carriers occurring in the lower part of the source/drain region section 30 to the N-type impurity layer 10a of the photoelectric conversion section 10 through the lower part of the element isolation region section 40. That is, the solid-state imaging device 100 according to the present embodiment can further reduce dark current.

The above-described effect of reducing dark current in the solid-state imaging device 100 according to the present embodiment will be described in the following more concretely by comparison with the technique for reducing dark current which technique is proposed in the above-described Patent Document 1, for example.

In the above Patent Document 1, as described above, the outflow of carriers to an adjacent pixel is suppressed by making the impurity concentration of a P-type well forming the source/drain region of a MOS transistor higher than the impurity concentration of a P-type well forming a light receiving section. With this constitution, however, carriers occurring in a lower region of the source/drain region cannot be sufficiently absorbed in a high-concentration N-type impurity region of the source/drain region. Thus, the technique proposed in the above Patent Document 1 cannot sufficiently suppress the outflow of carriers occurring in the lower part of the source/drain region to the light receiving section, and has difficulty in reducing dark current.

On the other hand, as described above, in the present embodiment, the second P-type well 52 of high impurity concentration is provided in the region between the source/drain region section 30 and the photoelectric conversion section 10, and thereby a barrier for carriers is formed in the region. Therefore, the present embodiment makes it difficult for carriers occurring at a deep position in the lower part of the source/drain region section 30 to flow out to the photoelectric conversion section 10 due to the barrier formed in the region between the source/drain region section 30 and the photoelectric conversion section 10, and is thus able to further reduce dark current.

Incidentally, while description has been made of an example in which the second P-type well 52 is formed so as to surround the periphery of the source/drain region section 30 in the above-described solid-state imaging device 100 according to the present embodiment, the present disclosure is not limited to this. For example, it suffices to dispose the second P-type well 52 at least in the region between the photoelectric conversion section 10 and the source/drain region section 30. However, the outflow of carriers occurring in the lower part of the source/drain region section 30 to the photoelectric conversion section 10 can be suppressed more when the second P-type well 52 surrounds the periphery of the source/drain region section 30 as in the present embodiment.

In addition, the above description has been made of an example in which the position of the lower surface of the second P-type well 52 (surface on the side of the N-type semiconductor substrate 101) is deeper than the position of the lower surface of the N-type impurity layer 10a in the photoelectric conversion section 10 (is positioned on the side of the N-type semiconductor substrate 101). However, the present disclosure is not limited to this. The depth of the second P-type well 52 (thickness in the Z-direction of the second P-type well 52) can be set arbitrarily as long as the second P-type well 52 has such a depth as to sufficiently suppress the outflow of carriers from the lower part of the source/drain region section 30 to the photoelectric conversion section 10.

For example, the second P-type well 52 may be formed such that the lower surface of the second P-type well 52 reaches the N-type semiconductor substrate 101. In the present embodiment, however, it suffices principally to be able to suppress the outflow of carriers from the first P-type well 51 in the lower part of the source/drain region section 30 to the photoelectric conversion section 10. Thus, in the present embodiment, the above-described effect of suppressing the outflow of carriers can be obtained sufficiently by forming the second P-type well 52 so as to span the depth region from the position of the lower surface of the element isolation region section 40 to about the position in the vicinity of the lower surface of the first P-type well 51. That is, it suffices for a distance between the lower surface of the second P-type well 52 and the N-type semiconductor substrate 101 to be equal to or greater than a distance between the lower surface of the first P-type well 51 and the N-type semiconductor substrate 101 in the Z-direction in FIG. 3 (direction of thickness of the N-type semiconductor substrate 101).

2. Second Embodiment

In a second embodiment, description will be made of an example in which a P-type well having a higher impurity concentration than a first P-type well 51 is provided in not only a region between a photoelectric conversion section 10 and a source/drain region section 30 but also a region between the photoelectric conversion section 10 and a charge-to-voltage converting section 20.

Figure 4:
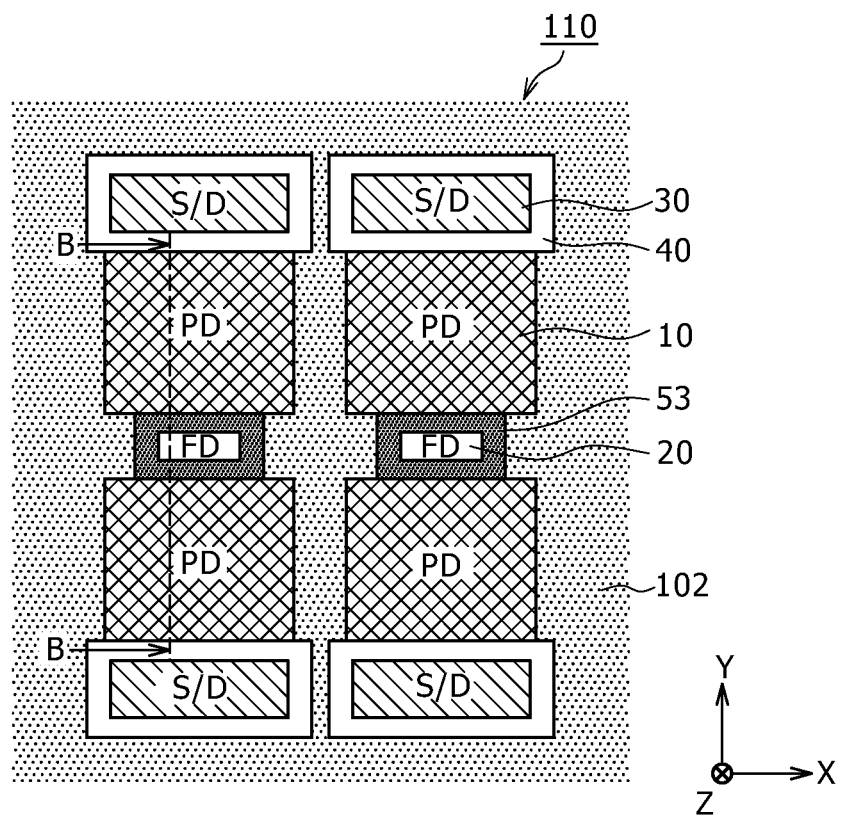
FIG. 4 is a diagram showing an example of a schematic constitution of the vicinity of photoelectric conversion sections in a solid-state imaging device according to a second embodiment.
Figure 5:
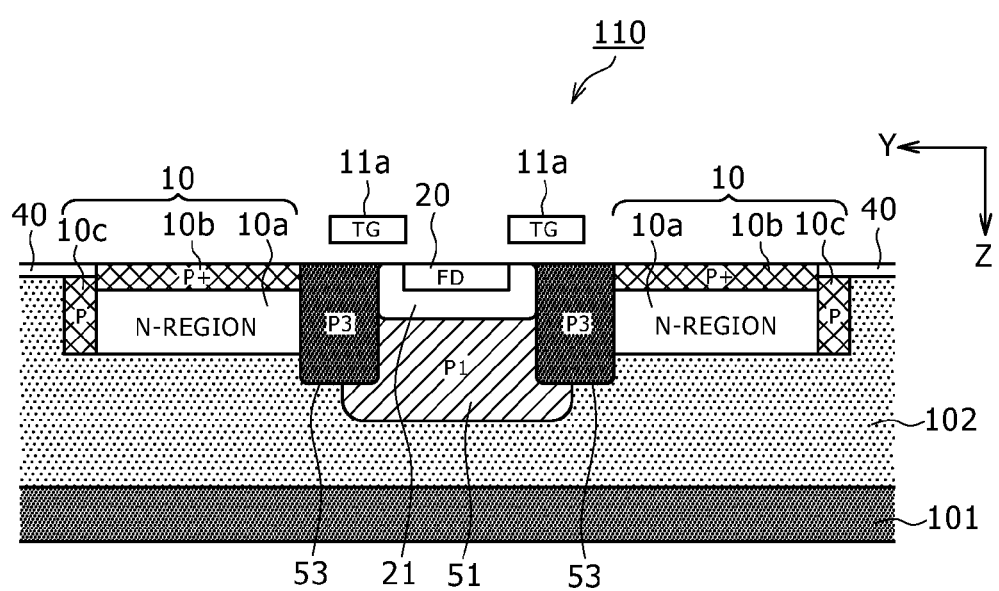
FIG. 5 is a sectional view taken along a line B-B of FIG. 4.

FIG. 4 and FIG. 5 show a schematic constitution of parts in the vicinity of a photoelectric conversion section 10 in a solid-state imaging device according to a second embodiment. Incidentally, FIG. 4 is a schematic diagram of an arrangement of the parts in the vicinity of the photoelectric conversion section 10 in a light receiving surface of the solid-state imaging device 110 according to the present embodiment (in an XY plane in FIG. 4). FIG. 5 is a sectional view taken along a line B-B of FIG. 4. In the solid-state imaging device 110 according to the present embodiment shown in FIG. 4 and FIG. 5, similar constituent elements to those of the solid-state imaging device 100 according to the foregoing first embodiment shown in FIG. 2 and FIG. 3 are identified by the same reference numerals.

(1) Constitution of Solid-State Imaging Device

The solid-state imaging device 110 includes an N-type semiconductor substrate 101 and a P-type epitaxial layer 102 formed on the N-type semiconductor substrate 101, as in the foregoing first embodiment. The solid-state imaging device 110 also includes a photoelectric conversion section 10, a first P-type well 51, and a third P-type impurity layer 53 (third impurity layer, which will hereinafter be referred to as a third P-type well 53), the photoelectric conversion section 10, the first P-type well 51, and the third P-type well 53 being formed on the P-type epitaxial layer 102.

The solid-state imaging device 110 further includes a charge-to-voltage converting section 20 and a source/drain region section 30 of an NMOS transistor, the charge-to-voltage converting section 20 and the source/drain region section 30 being formed on the first P-type well 51, as in the foregoing first embodiment. The solid-state imaging device 110 also includes an element isolation region section 40 disposed in a region between the photoelectric conversion section 10 and the source/drain region section 30, as in the foregoing first embodiment. Incidentally, the source/drain region section 30 shown in FIG. 4 is the source/drain region section of the amplifying section 13 in FIG. 1.

In addition, in the present embodiment, the third P-type well 53 is disposed in a region between the photoelectric conversion section 10 and the charge-to-voltage converting section 20. Incidentally, in the example shown in FIG. 5, a depletion layer 21 is formed at a boundary between the charge-to-voltage converting section 20 and the first P-type well 51. In FIG. 4, however, the depletion layer 21 is not shown in order to simplify description.

As is clear from comparison between FIG. 4 and FIG. 2, the arrangement and constitution of the photoelectric conversion section 10, the charge-to-voltage converting section 20, the source/drain region section 30, and the element isolation region section 40 in the light receiving surface of the solid-state imaging device 110 (in the XY plane in FIG. 4) are similar to those of the foregoing first embodiment. In addition, though not shown in FIG. 5, an internal constitution of a region between the photoelectric conversion section 10 and the source/drain region section 30 (constitution of the lower part of the element isolation region section 40) in a Z-direction in FIG. 5 (direction of thickness of the N-type semiconductor substrate 101) is similar to the constitution (FIG. 3) of the foregoing first embodiment.

That is, the solid-state imaging device 110 according to the present embodiment has a constitution including the third P-type well 53 newly provided in a region between the photoelectric conversion section 10 and the charge-to-voltage converting section 20 in the solid-state imaging device 100 according to the foregoing first embodiment. The other constitution is similar to the constitution of the foregoing first embodiment. Description in the following will therefore be made only of the constitution and functions of the third P-type well 53.

(2) Constitution of Third P-Type Well

The third P-type well 53 is formed by a P-type impurity layer having an impurity concentration P3 (third impurity concentration: $P1<P3\leq P2$) higher than the impurity concentration P1 of the first P-type well 51 and nearly equal to or lower than the impurity concentration P2 of a second P-type well 52. Incidentally, while the third P-type well 53 is generally formed by a technique of ion implantation, for example, the present disclosure is not limited to this. The third P-type well 53 may be formed by a technique of selective epitaxial growth, for example.

In addition, as shown in FIG. 5, the third P-type well 53 is formed in the region between the photoelectric conversion section 10 and the charge-to-voltage converting section 20. Incidentally, in the present embodiment, as shown in FIG. 4, the third P-type well 53 is formed so as to surround the periphery of the charge-to-voltage converting section 20. However, the present disclosure is not limited to this. It suffices at least to provide the third P-type well 53 in the region between the photoelectric conversion section 10 and the charge-to-voltage converting section 20.

Further, the third P-type well 53 is formed so as to span a region from a same position as the position of the surface of the charge-to-voltage converting section 20 to a deep position in the first P-type well 51 (position nearer to the N-type semiconductor substrate 101) in the Z-direction in FIG. 5. Incidentally, FIG. 5 shows an example in which the third P-type well 53 is formed in a region from the same position as the position of the surface of the charge-to-voltage converting section 20 to a position deeper than the lower surface (surface on the side of the N-type semiconductor substrate 101) of an N-type impurity layer 10a in the photoelectric conversion section 10.

The depth of the third P-type well 53 (thickness in the Z-direction in FIG. 5 of the third P-type well 53) is not limited to the example shown in FIG. 5. The depth of the third P-type well 53 can be set arbitrarily as long as the third P-type well 53 has such a depth as to be able to sufficiently suppress the outflow of carriers from the lower part of the charge-to-voltage converting section 20 to the photoelectric conversion section 10.

For example, the third P-type well 53 may be formed such that the lower surface of the third P-type well 53 reaches the N-type semiconductor substrate 101. In the present embodiment, however, it suffices principally to be able to suppress the outflow of carriers from the first P-type well 51 in the lower part of the charge-to-voltage converting section 20 to the photoelectric conversion section 10. Thus, in the present embodiment, the above-described effect of suppressing the outflow of carriers can be obtained sufficiently by forming the third P-type well 53 so as to span the depth region from the position of the surface of the charge-to-voltage converting section 20 to about the position in the vicinity of the lower surface of the first P-type well 51. That is, it suffices for a distance between the lower surface of the third P-type well 53 and the N-type semiconductor substrate 101 to be equal to or greater than a distance between the lower surface of the first P-type well 51 and the N-type semiconductor substrate 101 in the Z-direction in FIG. 5 (direction of thickness of the N-type semiconductor substrate 101).

As described above, in the present embodiment, the third P-type well 53 having the impurity concentration P3 higher than that of the first P-type well 51 is disposed in the region between the charge-to-voltage converting section 20 (and the first P-type well 51 disposed in the lower part of the charge-to-voltage converting section 20) and the photoelectric conversion section 10. Thereby, a barrier for carriers occurring in the lower part (lower region) of the charge-to-voltage converting section 20 is formed in the region between the photoelectric conversion section 10 and the charge-to-voltage converting section. As a result, the present embodiment can suppress the outflow of carriers occurring in the lower part of the charge-to-voltage converting section 20 to the photoelectric conversion section 10.

That is, the solid-state imaging device 110 according to the present embodiment can suppress not only the outflow of carriers occurring in the lower region of the source/drain region section 30 to the photoelectric conversion section 10 but also the outflow of carriers occurring in the lower region of the charge-to-voltage converting section 20 to the photoelectric conversion section 10. Thus, the solid-state imaging device 110 according to the present embodiment can further reduce dark current.

In addition, in the present embodiment, as described above, the impurity concentration P3 of the third P-type well 53 is made nearly equal to or lower than the impurity concentration P2 of the second P-type well 52 (P3≤P2). This is for the following reasons. For example, the NMOS transistor forming the transfer section 11 within the pixel 1 described in FIG. 1 is disposed on the region between the photoelectric conversion section 10 and the charge-to-voltage converting section 20, that is, on the third P-type well 53, as shown in FIG. 5. Incidentally, FIG. 5 shows only the transfer gate 11a of the transfer section 11 in order to simplify description.

That is, the surface region of the third P-type well 53 in the solid-state imaging device 110 according to the present embodiment serves also as a transfer region at a time of transferring a signal charge converted by the photoelectric conversion section 10 to the charge-to-voltage converting section 20. Too high an impurity concentration P3 of this transfer region can hinder the operation of transferring the signal charge. Accordingly, in the present embodiment, the impurity concentration P3 of the third P-type well 53 is made nearly equal to or lower than the impurity concentration P2 of the second P-type well 52 to facilitate the transfer of the signal charge in the transfer region.

3. Third Embodiment

In a third embodiment, description will be made of an example of a constitution in which a photoelectric conversion section 10 and a source/drain region section 30 are separated from each other by an element isolation region section 40 formed by LOCOS or STI and photoelectric conversion sections 10 adjacent to each other are separated from each other by diffusion isolation.

Figure 6:
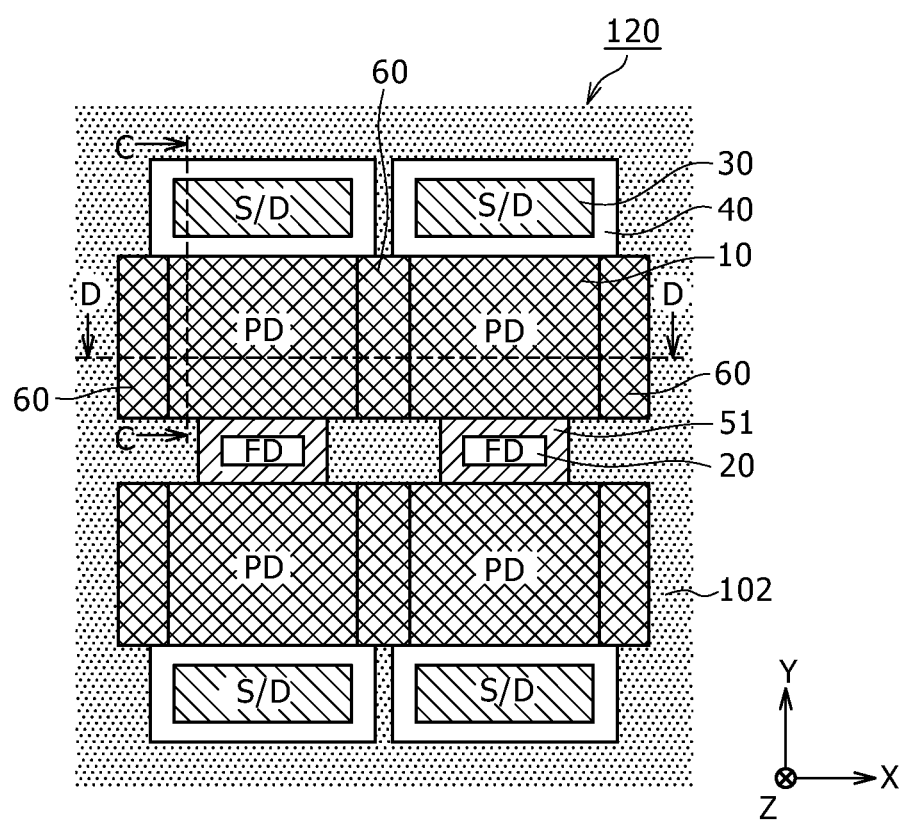
FIG. 6 is a diagram showing an example of a schematic constitution of the vicinity of photoelectric conversion sections in a solid-state imaging device according to a third embodiment.
Figure 7:
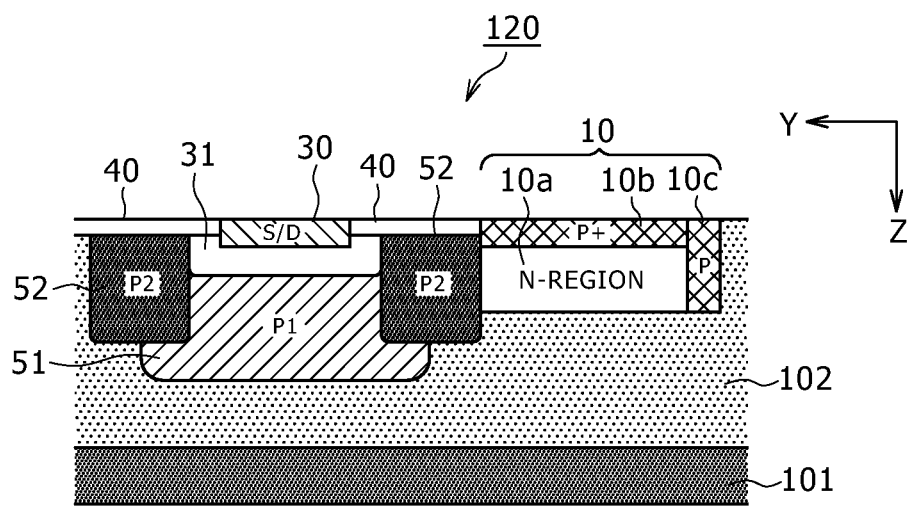
FIG. 7 is a sectional view taken along a line C-C of FIG. 6.
Figure 8:
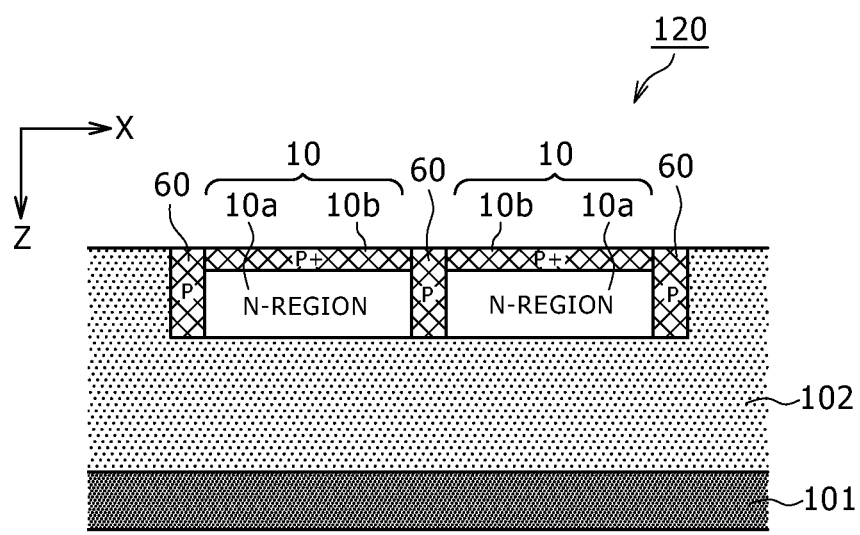
FIG. 8 is a sectional view taken along a line D-D of FIG. 6.

FIGS. 6 to 8 show a schematic constitution of parts in the vicinity of a photoelectric conversion section 10 in a solid-state imaging device according to a third embodiment. Incidentally, FIG. 6 is a schematic diagram of an arrangement of the parts in the vicinity of the photoelectric conversion section 10 in a light receiving surface of the solid-state imaging device 120 according to the present embodiment (in an XY plane in FIG. 6). FIG. 7 is a sectional view taken along a line C-C of FIG. 6. FIG. 8 is a sectional view taken along a line D-D of FIG. 6. In the solid-state imaging device 120 according to the present embodiment shown in FIGS. 6 to 8, similar constituent elements to those of the solid-state imaging device 100 according to the foregoing first embodiment shown in FIG. 2 and FIG. 3 are identified by the same reference numerals.

(1) Constitution of Solid-State Imaging Device

The solid-state imaging device 120 includes an N-type semiconductor substrate 101 and a P-type epitaxial layer 102 formed on the N-type semiconductor substrate 101, as in the foregoing first embodiment. The solid-state imaging device 120 also includes a photoelectric conversion section 10, a first P-type well 51, a second P-type well 52, and a diffusion isolation region section 60 (diffusion isolation layer), the photoelectric conversion section 10, the first P-type well 51, the second P-type well 52, and the diffusion isolation region section 60 being formed on the P-type epitaxial layer 102. Incidentally, the diffusion isolation region section 60 is disposed in a region between photoelectric conversion sections 10 adjacent to each other in an X-direction in FIG. 6.

The solid-state imaging device 120 further includes a charge-to-voltage converting section 20 and a source/drain region section 30 of an NMOS transistor, the charge-to-voltage converting section 20 and the source/drain region section 30 being formed on the first P-type well 51, as in the foregoing first embodiment. The solid-state imaging device 120 also includes an element isolation region section 40 disposed in a region between the photoelectric conversion section 10 and the source/drain region section 30, as in the foregoing first embodiment. Incidentally, the source/drain region section 30 shown in FIG. 6 and FIG. 7 is the source/drain region section of the amplifying section 13 in FIG. 1.

As is clear from comparison between FIG. 6 and FIG. 2, the arrangement and constitution of the photoelectric conversion section 10, the charge-to-voltage converting section 20, the source/drain region section 30, and the element isolation region section 40 in the light receiving surface of the solid-state imaging device 120 (in the XY plane in FIG. 6) are similar to those of the foregoing first embodiment. In addition, as is clear from comparison between FIG. 7 and FIG. 3, an internal constitution of a region between the photoelectric conversion section 10 and the source/drain region section 30 (constitution of the lower part of the element isolation region section 40) in a Z-direction in FIG. 7 is also similar to the constitution (FIG. 3) of the foregoing first embodiment.

That is, the solid-state imaging device 120 according to the present embodiment has a constitution including the diffusion isolation region section 60 newly provided in the region between the photoelectric conversion sections 10 adjacent to each other in the solid-state imaging device 100 according to the foregoing first embodiment. The other constitution is similar to the constitution of the foregoing first embodiment. Description in the following will therefore be made only of the constitution and functions of the diffusion isolation region section 60.

(2) Constitution of Diffusion Isolation Region Section

The diffusion isolation region section 60 is formed by a P-type impurity layer. The diffusion isolation region section 60 is formed by a technique of ion implantation, for example. Incidentally, the impurity concentration of the diffusion isolation region section 60 is set higher than the impurity concentration of the P-type epitaxial layer 102.

The diffusion isolation region section 60 is formed so as to span a region from a same position as the position of the surfaces of the photoelectric conversion sections 10 to a same position as the lower surface of an N-type impurity layer 10a (surface on the side of the N-type semiconductor substrate 101) in a Z-direction in FIG. 8 (direction of thickness of the N-type semiconductor substrate 101). Incidentally, the depth of the diffusion isolation region section 60 (thickness in the Z-direction in FIG. 8 of the diffusion isolation region section 60) is not limited to the example shown in FIG. 8, but may be set arbitrarily as long as the diffusion isolation region section 60 has such a depth as to be able to sufficiently separate the photoelectric conversion sections 10 adjacent to each other in an X-direction in FIG. 8.

When the photoelectric conversion sections 10 adjacent to each other in the X-direction in FIG. 8 are separated from each other by diffusion isolation as in the present embodiment, the width of the region for separating the photoelectric conversion sections 10 from each other can be narrower than in a case where the photoelectric conversion sections 10 adjacent to each other are separated from each other by element isolation by a method of LOCOS or STI, for example.

In addition, in the present embodiment, the second P-type well 52 having an impurity concentration P2 higher than that of the first P-type well 51 is disposed in the lower part of the element isolation region section 40 formed between the photoelectric conversion section 10 and the source/drain region section 30. Thus, similar effects to those of the foregoing first embodiment are obtained.

Incidentally, in the present embodiment, description has been made of an example in which the diffusion isolation region section 60 is provided to the solid-state imaging device 100 according to the foregoing first embodiment. However, the present disclosure is not limited to this. The diffusion isolation region section 60 may be provided in a region between photoelectric conversion sections 10 adjacent to each other in the solid-state imaging device 110 according to the foregoing second embodiment.

4. Fourth Embodiment

In a fourth embodiment, description will be made of an example in which a second P-type well formed in a region between a photoelectric conversion section 10 and a source/drain region section 30 is disposed within the region of a first P-type well on which the source/drain region section 30 is formed. Incidentally, the constitution of the present embodiment is suitable for uses in which sufficient pixel characteristics such as sensitivity, for example, can be secured even when a pitch between pixels 1 is relatively increased.

Figure 9:
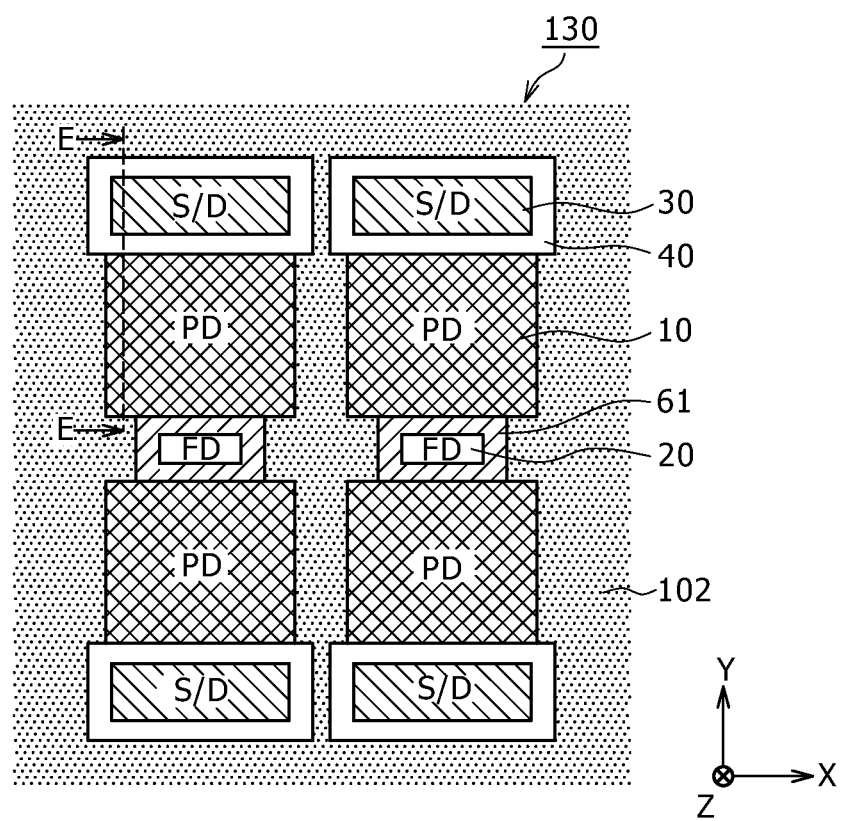
FIG. 9 is a diagram showing an example of a schematic constitution of the vicinity of photoelectric conversion sections in a solid-state imaging device according to a fourth embodiment.
Figure 10:
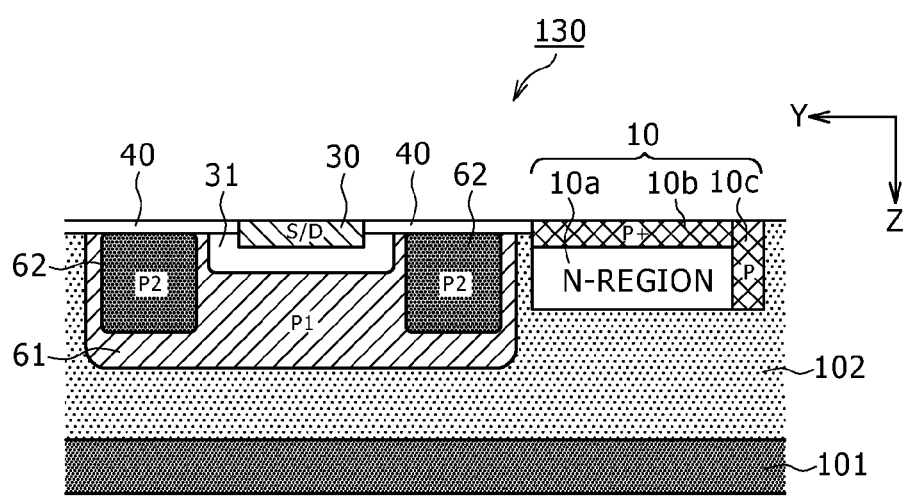
FIG. 10 is a sectional view taken along a line E-E of FIG. 9.

FIG. 9 and FIG. 10 show a schematic constitution of parts in the vicinity of a photoelectric conversion section 10 in a solid-state imaging device according to a fourth embodiment. Incidentally, FIG. 9 is a schematic diagram of an arrangement of the parts in the vicinity of the photoelectric conversion section 10 in a light receiving surface of the solid-state imaging device 130 according to the present embodiment (in an XY plane in FIG. 9). FIG. 10 is a sectional view taken along a line E-E of FIG. 9. In the solid-state imaging device 130 according to the present embodiment shown in FIG. 9 and FIG. 10, similar constituent elements to those of the solid-state imaging device 100 according to the foregoing first embodiment shown in FIG. 2 and FIG. 3 are identified by the same reference numerals.

(1) Constitution of Solid-State Imaging Device

The solid-state imaging device 130 includes an N-type semiconductor substrate 101 and a P-type epitaxial layer 102 formed on the N-type semiconductor substrate 101, as in the foregoing first embodiment. The solid-state imaging device 130 also includes a photoelectric conversion section 10 and a first P-type well 61, the photoelectric conversion section 10 and the first P-type well 61 being formed on the P-type epitaxial layer 102.

The solid-state imaging device 130 further includes a charge-to-voltage converting section 20, a source/drain region section 30 of an NMOS transistor, and a second P-type well 62, the charge-to-voltage converting section 20, the source/drain region section 30, and the second P-type well 62 being formed on the first P-type well 61. The solid-state imaging device 130 also includes an element isolation region section 40 disposed between the photoelectric conversion section 10 and the source/drain region section 30, as in the foregoing first embodiment. Incidentally, the source/drain region section 30 shown in FIG. 9 and FIG. 10 is the source/drain region section of the amplifying section 13 in FIG. 1.

As is clear from comparison between FIG. 9 and FIG. 2, the arrangement and constitution of the photoelectric conversion section 10, the charge-to-voltage converting section 20, the source/drain region section 30, and the element isolation region section 40 in the light receiving surface of the solid-state imaging device 130 (in the XY plane in FIG. 9) are similar to those of the foregoing first embodiment.

In addition, as is clear from comparison between FIG. 10 and FIG. 3, the constitution of the present embodiment is similar to the constitution (FIG. 3) of the foregoing first embodiment except that the second P-type well 62 is formed within the first P-type well 61 in the lower part (region on the side of the N-type semiconductor substrate 101) of the element isolation region section 40.

That is, the solid-state imaging device 130 according to the present embodiment has a constitution obtained by forming the second P-type well 52 within the first P-type well 51 in the solid-state imaging device 100 according to the foregoing first embodiment. The other constitution is similar to the constitution of the foregoing first embodiment. Description in the following will therefore be made only of a constitution of the second P-type well 62 and the vicinity thereof, that is, an internal constitution of the lower part of the element isolation region section 40.

(2) Constitution of Lower Part of Element Isolation Region Section (Constitution of Second P-Type Well)

In the present embodiment, as shown in FIG. 10, the second P-type well 62 is disposed in the lower part of the element isolation region section 40 (region between the photoelectric conversion section 10 and the source/drain region section 30) and within the region of the first P-type well 61. In addition, in the present embodiment, as in the foregoing first embodiment, the second P-type well 62 is formed so as to surround the periphery of the source/drain region section 30. Incidentally, the present disclosure is not limited to this. It suffices to provide the second P-type well 62 at least in the region between the photoelectric conversion section 10 and the source/drain region section 30.

Incidentally, the impurity concentration P2 of the second P-type well 62 is set higher than the impurity concentration P1 of the first P-type well 61 (P1<P2), as in the foregoing first embodiment. In addition, the depth of the second P-type well 62 can be set in a similar manner to the depth of the second P-type well 52 in the foregoing first embodiment.

When the second P-type well 62 is formed within the first P-type well 61 as in the present embodiment, a part of the region of the first P-type well 61 is disposed in a region between the second P-type well 62 and the photoelectric conversion section 10. That is, in the present embodiment, regions of the first P-type well 61, the second P-type well 62, and the first P-type well 61 are arranged in this order from the source/drain region section 30 to the photoelectric conversion section 10 in the region between the source/drain region section 30 and the photoelectric conversion section 10. Thereby, a concentration profile in which impurity concentration changes in order of P1 (low concentration), P2 (high concentration), and P1 (low concentration) from the source/drain region section 30 to the photoelectric conversion section 10 is formed in the region between the source/drain region section 30 and the photoelectric conversion section 10.

As a result, also in the present embodiment, a barrier for carriers occurring in the lower part of the source/drain region section 30 is formed in the region between the source/drain region section 30 and the photoelectric conversion section 10. Thus, as with the foregoing first embodiment, the present embodiment can suppress the outflow of carriers occurring in the lower part of the source/drain region section 30 to the photoelectric conversion section 10, and thereby suppress dark current.

Incidentally, in the present embodiment, description has been made of an example in which the constitution having the second P-type well 62 within the region of the first P-type well 61 is applied to the solid-state imaging device 100 according to the foregoing first embodiment. However, the present disclosure is not limited to this. For example, the above-described constitution of the second P-type well 62 in the present embodiment may be applied to the solid-state imaging device according to the foregoing second embodiment or the foregoing third embodiment. In addition, all of the constitutions described in the foregoing second to fourth embodiments may be applied to the solid-state imaging device according to the foregoing first embodiment.

Description has been made of an example in which the solid-state imaging devices according to the foregoing first to fourth embodiments have the second P-type well in the region between the source/drain region section of the NMOS transistor of the amplifying section 13 and the photoelectric conversion section forming the pixel 1 shown in FIG. 1. However, the present disclosure is not limited to this. For example, the second P-type well may be provided not only to the amplifying section 13 but also to a region between the source/drain region section of the NMOS transistor of the reset section 12 and/or the selecting section 14 and the photoelectric conversion section.

In addition, all of the conductivity types (the P-type and the N-type) of carriers in the respective parts in the solid-state imaging devices according to the foregoing first to fourth embodiments may be reversed.

Incidentally, the present disclosure can also adopt the following constitutions.

(1) A solid-state imaging device including:
a substrate;
a photoelectric conversion section configured to convert incident light into a signal charge, the photoelectric conversion section being disposed on the substrate and including an impurity region having a carrier polarity of a first conductivity type;
a first impurity layer being disposed on the substrate, having a carrier polarity of a second conductivity type opposite from the first conductivity type, and having a first impurity concentration;
a charge-to-voltage converting section configured to convert the signal charge converted by the photoelectric conversion section into voltage, the charge-to-voltage converting section being disposed on the first impurity layer and including an impurity region having a carrier polarity of the first conductivity type;
an amplifying section configured to amplify the voltage converted by the charge-to-voltage converting section, the amplifying section being disposed on the first impurity layer and including a source/drain region having a carrier polarity of the first conductivity type; and a second impurity layer disposed in a region between the photoelectric conversion section and the amplifying section, having a carrier polarity of the second conductivity type, and having a second impurity concentration higher than the first impurity concentration.

(2) The solid-state imaging device according to (1), further including:
a transfer section configured to transfer the signal charge from the photoelectric conversion section to the charge-to-voltage converting section, the transfer section being disposed in a region between the photoelectric conversion section and the charge-to-voltage converting section; and
a third impurity layer disposed in a region of the transfer section on a side of the substrate, having a carrier polarity of the second conductivity type, and having a third impurity concentration higher than the first impurity concentration and equal to or lower than the second impurity concentration.

(3) The solid-state imaging device according to (2),
wherein a distance between a surface of the third impurity layer on the side of the substrate and the substrate in a direction of thickness of the substrate is equal to or more than a distance between a surface of the first impurity layer on the side of the substrate and the substrate in the direction of thickness of the substrate.

(4) The solid-state imaging device according to one of (1) to (3),
wherein a distance between a surface of the second impurity layer on a side of the substrate and the substrate in a direction of thickness of the substrate is equal to or more than a distance between a surface of the first impurity layer on the side of the substrate and the substrate in the direction of thickness of the substrate.

(5) The solid-state imaging device according to one of (1) to (4), further including an element isolation layer formed by a technique of one of LOCOS and STI between the photoelectric conversion section and the amplifying section.

(6) The solid-state imaging device according to one of (1) to (5), further including:
a plurality of the photoelectric conversion sections arranged in a predetermined direction; and
a diffusion isolation layer formed by a technique of diffusion isolation in a region between the photoelectric conversion sections adjacent to each other in the predetermined direction.

(7) The solid-state imaging device according to one of (1) to (6),
wherein the second impurity layer is disposed within the first impurity layer.

(8) The solid-state imaging device according to one of (1) to (7),
wherein the first conductivity type is an N-type, and the second conductivity type is a P-type.

The present disclosure contains subject matter related to that disclosed in Japanese Priority Patent Application JP 2011-045329 filed in the Japan Patent Office on Mar. 2, 2011, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:
1. A solid-state imaging device comprising:
a substrate;
a well region disposed on the substrate;

a photoelectric conversion section configured to convert incident light into a signal charge, the photoelectric conversion section being disposed on the well region;

at least one transistor section disposed on the well region;

an isolation region disposed in a region between the photoelectric conversion section and the transistor section; and an impurity layer located below the isolation region.

2. The solid-state imaging device according to claim 1, wherein at least the one transistor section is a transfer transistor.

3. The solid-state imaging device according to claim 2, wherein the transfer transistor configured to transfer the signal charge from the photoelectric conversion section to the charge-to-voltage converting section, the transfer section being disposed in a region between the photoelectric conversion section and the charge-to-voltage converting section.

4. The solid-state imaging device according to claim 1, wherein at least the one transistor section is an amplifier transistor.

5. The solid-state imaging device according to claim 1, wherein the isolation layer formed by a technique of one of LOCOS and STI.

6. The solid-state imaging device according to claim 1, further comprising:

a plurality of the photoelectric conversion sections arranged in a predetermined direction; and a diffusion isolation layer formed by a technique of diffusion isolation in a region between the photoelectric conversion sections adjacent to each other in the predetermined direction.

7. The solid-state imaging device according to claim 1, wherein the impurity layer is disposed within the well region.

* * * * *